United States Patent [19]

Panepinto, Jr. et al.

[11] 4,303,993
[45] Dec. 1, 1981

[54] MEMORY PRESENT APPARATUS

[75] Inventors: William Panepinto, Jr., Tewksbury; Chester M. Nibby, Jr., Peabody, both of Mass.

[73] Assignee: Honeywell Information Systems Inc., Waltham, Mass.

[21] Appl. No.: 83,438

[22] Filed: Oct. 10, 1979

[51] Int. Cl.$^3$ .......................................... G11C 13/00
[52] U.S. Cl. .................................. 365/230; 364/200; 365/189; 365/200
[58] Field of Search ............... 365/189, 230, 222, 200; 364/200

[56] References Cited

U.S. PATENT DOCUMENTS

| 3,803,560 | 4/1974 | Devay | 364/200 |
| 4,001,790 | 1/1977 | Barlow | 364/200 |

Primary Examiner—Terrell W. Fears
Attorney, Agent, or Firm—Faith F. Driscoll; Nicholas Prasinos; Ronald T. Reiling

[57] ABSTRACT

A memory subsystem includes at least one up to a number of memory module boards identical in layout and construction. The board includes a number of memory chips which are positioned in a number of physical row locations together providing a predetermined number of addressable contiguous memory locations corresponding to a predetermined increment of memory capacity. The board includes a set of switches whose input terminals are connected to receive predetermined ones of a plurality of address signals. These predetermined signals are coded specifying the segments of memory being accessed. The signals applied to the switch output terminals are logically combined and the resulting signal is applied to a group of memory present circuits connected to receive other ones of the address signals representative of the row of chips being addressed. By altering the set of switches, the group of memory present circuits can be conditioned to generate an output signal for indicating that the same increment is present for accessing within any one of a number of different segments thereby enabling the same board to be used in any available address slot position.

31 Claims, 5 Drawing Figures

MEMORY PRESENT APPARATUS

BACKGROUND OF THE INVENTION

1. Field of Use

The present invention relates to memory systems and more particularly to apparatus and a method for simplifying the construction and expansion of such systems.

2. Prior Art

It is well known to construct memory systems utilizing a number of small memory modules. Normally, a small increment of memory is selected for the module size because it has the advantage of losing less memory space in the event of failure. For further discussion of such systems, reference may be made to U.S. Pat. No. 3,803,560 which is assigned to the same assignee as named herein.

In addition to the above, modular memory systems permit ready expansion of the users memory system capacity or memory space when desired. In order to accommodate such expansion, memory system manufacturers have been required to construct a number of different memory systems having different memory capacities or different size increments of memory. This, in turn, has necessitated the construction of a number of different types of memory units.

One prior art system disclosed in U.S. Pat. No. 4,001,790 assigned to the same assignee as named herein employs an arrangement which can utilize the same memory board construction for any one of a number of memory modules connected to a memory controller.

In the arrangement, one type of memory board (mother board) includes the control logic circuits and another type memory board (daughter board) contains the memory module. It is required that the memory module board be capable of being plugged into any one of a number of different positions.

In this type of arrangement, it is possible to upgrade and expand the memory system utilizing the two types of memory boards mentioned above. Here, the memory increment or memory size corresponds to the capacity of the daughter board.

Due to certain system and/or packaging requirements, it becomes desirable to include both control logic circuits and memory module circuits on a single board. Because of the densities of memory module circuits available, it becomes necessary to provide memory sizes which are less than maximum memory capacity contained on the memory board.

However, each time a purchased memory system constructed with such single board type having less than the maximum memory capacity is desired to be increased or upgraded, the user is required to purchase an additional memory board type which includes the added capacity. Also, for proper maintenance, field personnel are required to have on hand, spares for each different memory board type. To eliminate this, the copending patent application of Chester M. Nibby, Jr. et al titled "Rotating Chip Selection Technique and Apparatus" bearing Ser. No. 921,292 filed on July 3, 1978, discloses a memory board including rotating chip selection circuits which enables construction of a memory subsystem from a single board type. While this arrangement enables the memory subsystem to be upgraded by the addition of the same board type, further expansion beyond the maximum memory capacity of the board still requires utilization of different board types.

Accordingly, it is a primary object of the present invention to provide a technique and apparatus for constructing a low cost modular memory system.

It is a further object of the present invention to provide a memory module low in cost to construct and which can be upgraded beyond its maximum capacity at low cost.

SUMMARY OF THE INVENTION

The above objects of the present invention are achieved in a preferred embodiment of a memory subsystem constructed in accordance with the technique and apparatus of the present invention. The memory subsystem includes from one up to a predetermined number of memory module boards identical in construction. Each board includes a number of memory chips which are designated permanently fixed or positioned in a predetermined number of physical row locations. Each row of chips provides a predetermined number of addressable multibit memory locations corresponding to a predetermined memory increment or memory address space.

Each board further includes a set of switches whose input terminals are connected for receiving predetermined ones of a set of address signals representative of the memory location within a physical row of chips being addressed. These predetermined signals are coded to specify which one of a number of memory segments is being accessed. The signals applied to the output terminals of the set of manual switches are logically combined to generate a resulting signal designating the desired memory segment. The signal is applied to a group of memory present circuits included within the board. The memory present circuits are connected to receive other ones of the set of address signals representative of the row of chips being addressed. In response to the signals from the set of switches and the other address signals, the memory present circuits are operative to generate an output signal indicating that the increment of memory containing the memory location to be accessed is present. This in turn conditions other circuits on the board so as to enable access. By altering the set of switches, the group of memory present circuits can be conditioned to generate an output signal indicating the same increment of memory is present when a different memory segment is being addressed. This permits the memory subsystem to be constructed from one board type and such subsystem to be upgraded by merely adding or plugging into the subsystem other memory boards of identical construction and identically populated.

For example, assume that a user has purchased a memory subsystem which has a memory capacity of 64K (1K=1024) memory locations and inserts into the subsystem a memory module board which has 16K chips positioned at rows 0-3. The same user can upgrade or double his memory subsystem capacity by simply adding another such memory module board also having chips at rows 0-3. By normally altering the set of switches to generate signals specifying and address range of 64K-128K, the memory present circuits generate signals for enabling the addressing of only memory locations within the added memory address space. Thus, the arrangement of the present invention permits the replacement of any bad segment of the memory subsystem with the same memory board.

Additionally, the memory present circuits output signal is applied to logic circuits which connect to a predetermined one of the lines of the bus to which the memory module board connects in common with the central processing unit of a data processing system. Timing circuits within the module board cause an output signal to be applied to the line in response to the output signal received from the memory present circuits during an interval when the central processing unit is not generating a refresh command. This arrangement reduces the complexity of the system.

The novel features which are believed to be characteristic of the invention both as to its organization and method of operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

DESCRIPTION OF THE PREFERRED EMBODIMENT

System and Memory Module Board

Figure 1:
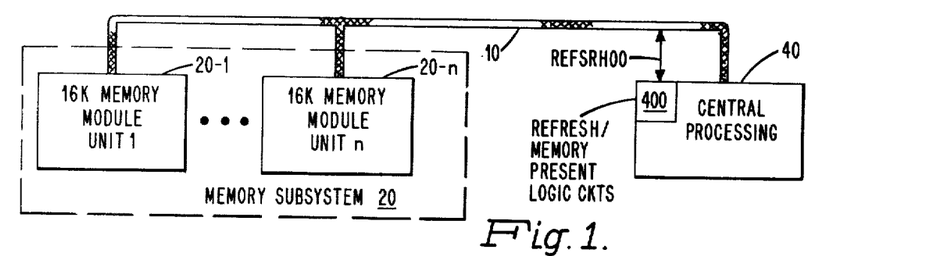
FIG. 1 shows in block diagram form a system which incorporates the method and apparatus of the present invention.

FIG. 1 shows in block diagram form, a data processing system which includes the apparatus of the present invention. As shown, the system includes a central processing unit (CPU) 40 which couples to a memory subsystem 20 through a common system bus 10. The CPU 40 includes refresh command and memory present logic circuits 400. These circuits generate refresh commands to the memory subsystem 20 and establish that the memory location being addressed is contained within a memory module which is present in the subsystem 20. As explained herein, for the purpose of the present invention, the CPU 40 may be considered conventional in design.

The memory subsystem 20 includes up to n memory module boards 20-1 through 20-n. The memory subsystem 20 may include up to a total of 262,144 16-bit words of addressable memory space. In the system shown each memory module board provides an increment of 16,384 16-bit words of memory space.

Figure 2:
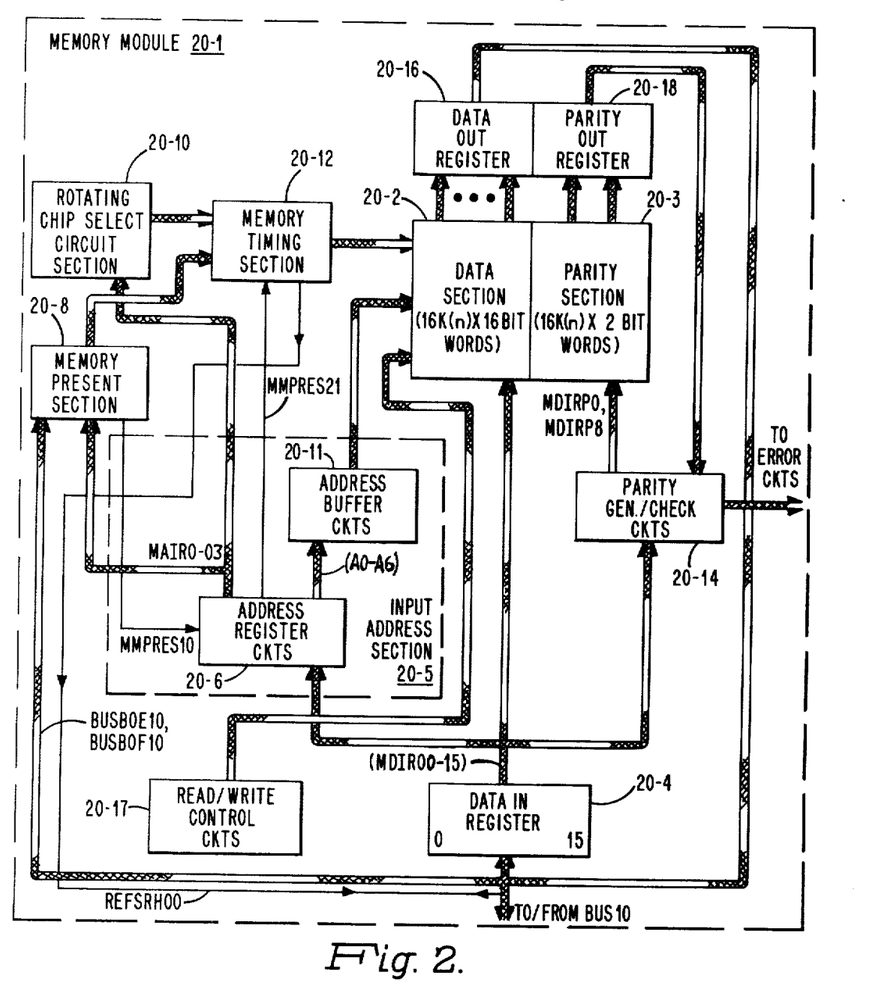
FIG. 2 shows in block diagram form the organization of a memory module board constructed in accordance with the principles of the present invention.

The organization of a memory module board, in accordance with the teachings of the present invention, is illustrated in FIG. 2. Referring to the Figure, it is seen that the memory module board 20-1 includes data section 20-2 and parity section 20-3. The sections include up to 4 rows of 16K (1K=1,024) 1-bit memory chips organized to form words which include 16 data bits and two parity bits. These chips are conventional in design and may take the form of the 16,384 word by one bit dynamic random access memory designated as Intel's 2116 manufactured by Intel Corporation.

Input data and address signals applied from bus 10 are loaded into a 16-bit data IN register 20-4. The address signals are loaded into a 16-bit address register 20-6 of input address section 20-5. The high order four bits of the address signals stored in register 20-6 (i.e., signals MAIR0-Q3) are applied as an input to a memory present section 20-8 while the high order two bits (i.e. signals MAIR0-1) are applied to a rotating chip select circuit section 20-10. The rotating chip select section 20-10 operates to generate signal corresponding to a logical row address. For further information regarding such circuits, reference may be made to the above referenced copending patent application of Chester M. Nibby, Jr. et al.

The memory present section 20-8 also receives signals BUSBOE10 and BUSBOF10 from bus 10. These signals correspond to two high order address bits OE and OF of FIG. 3. In response to such signals, section 20-8 generates signals indicative of the segment and increment of memory being addressed within the sections 20-2 and 20-3. These signals are applied as inputs to a memory timing 20-12. Section 20-12 provides the various clocking signals required for activating the circuits of sections 20-2 and 20-3 synchronizing the operations within subsystem 20-1. As explained herein, section 20-12 generates one of a predetermined number of row chip select signals for enabling selection of the 16K chips of a physical row location. It also generates a memory present signal on line REFSHR00 of bus 10 for signaling CPU 40 that the memory increment being addressed is present. The low order 14 address bits from register 20-6 are multiplexed and applied as inputs to the address buffer circuits of block 20-11 which applies them as inputs to sections 20-2 and 20-3.

Data signals loaded into register 20-4 are applied as inputs to data section 20-2 and to the parity generation/check circuits of block 20-14. The parity generation circuits of block 20-14, conventional in design, generate parity bit signals for each 8-bit byte of the data word which are written into the parity section 20-3 along with the data bits.

During read operation, data and parity bits of a word are read out into a data out register 20-16 and a parity out register 20-18. The parity bits are, in turn, applied to the parity generator/checker circuits 20-14. The results of the parity check are applied to error circuits, not shown. The data bits of the word are applied from data out register 20-16 to the bus 10.

The memory module board 20-1 further includes the read/write control circuits of block 20-17 which, for the purpose of the present invention, may be considered conventional in design. These circuits generate and write enable signals which are, in turn, applied to the 16K RAM chips of sections 20-2 and 20-3.

Figure 4:
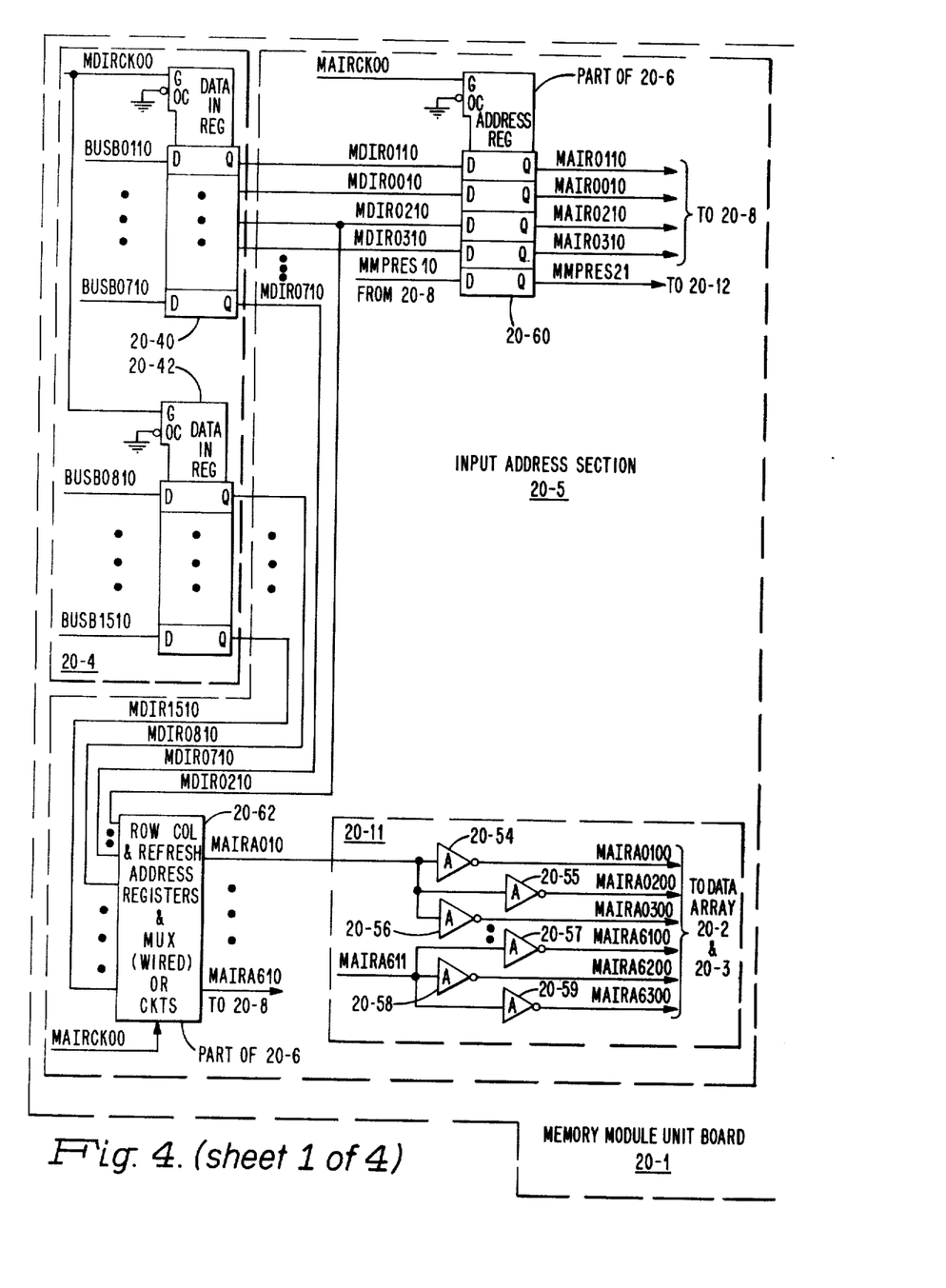
FIG. 4 shows in greater detail the organization of the memory module board of FIG. 2.

64K Memory Module Board—FIG. 4

FIG. 4 shows in greater detail a portion of the circuits of FIG. 2. The board is populated with four rows of 16K RAM chips for providing a 0–64K segment of addressable memory space. As explained herein, in accordance with the teachings of the present invention, the RAM chips are permanently positioned at physical row location 0. Referring to the Figure, it is seen that the data in register 20-4 includes a pair of 8-bit registers 20-40 and 20-42. Each of the registers receive a data in register clock signal MDIRCK00 generated by memory timing section 20-12.

As seen from FIG. 4, the signals stored in the data registers 20-40 and 20-42 are applied as inputs to the address registers of blocks 20-60 and 20-62. The address register 20-60 receives signals corresponding to the upper four address bits coded to designate a 4K increment within the 64K segment of memory. The register 20-60 also provides bit storage for the memory present signal MMPRES10 generated by section 20-8.

Figure 3:
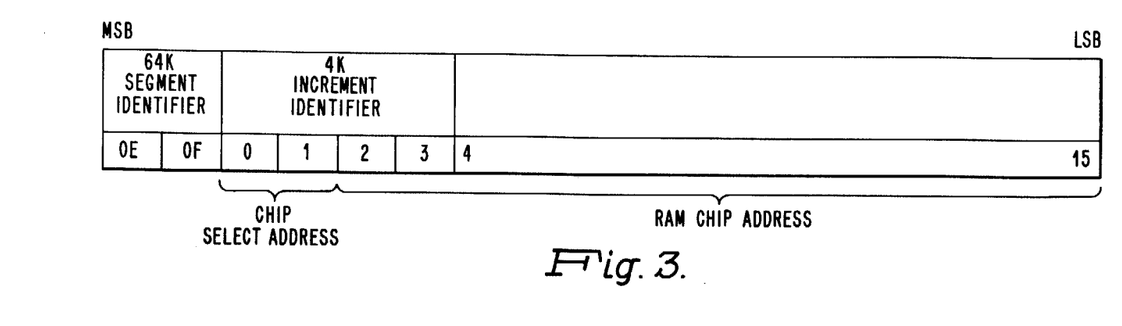
FIG. 3 illustrates the format of the address word used to access memory locations within the memory module board of FIG. 2.

The 16-bit address word is for addressing a 16K RAM chip module has the format illustrated in FIG. 3. Two 64K segment identifier bits are appended to the high order end of the 16-bit address word. The next four bits 0-3 serve as a 4K increment identifier code as mentioned. Bits 0-1 are coded to specify the chip physical row location being addressed. The remaining address bits 2-15 are coded to designate the address of a memory location within the row of 16K RAM chips of sections 20-2 and 20-3.

It will be appreciated that block 20-62 includes a plurality of registers for storing row, column and refresh addresses. The register outputs are multiplexed by connecting them in a wired OR arrangement. The registers included therein as well as registers 20-40, 20-42 and 20-60 are conventional in design. Such registers may be constructed from D type transparent latches and edge triggered flip-flops with provision for being operated in a tri-state mode of operation. For example, the registers may be constructed from integrated circuit chips designated as SN74S373, manufactured by Texas Instruments Incorporated. Such tri-state mode of operation permits multiplexing of the three different sets of address signals by the circuits of block 20-62. Signals MDIRCK00 and MAIRCK00 are generated by timing circuits (not shown) within section 20-12 for loading or gating data and address signals into the registers 20-40, 20-42, 20-60 and 20-62.

The output address signals MAIRA00 through MAIRA610 are applied through sets of inverter circuits 20-54 through 20-59 to the input address terminals of the row of chips of data section 20-2 and 20-3. Inverter circuits are used to provide adequate driving capability for the maximum number of chips includable within sections 20-2 and 20-3.

The memory present section 20-8 includes a four position range manually selectable switch 20-80 and a pair of eight position manually selectable segment switches 20-81 and 20-82. The range switch allows for the selection of one of four different segments of memory within a range of addresses from 0-256K as explained herein. As shown, the address bus signals BUSBOE10 and BUSBOF10 are applied via the pairs of inverter circuits 20-83, 20-83A, 20-84 and 20-84A to the input terminals of switch 20-80. Pairs of the output terminals of switch 20-80, after being "wired ored" together, are applied as inputs to an AND gate 20-85. The output signal MAIRAB10 from AND gate 20-85 is logically combined with signal MAIR0010 and its complement MAIR0000 from an inverter circuit 20-86 within a pair of NAND gates 20-87 and 20-88. Each of the outputs of these gates connect to the enabling input of one of the pair of multiplexer circuits 20-89 and 20-90.

The switches 20-81 and 20-82, the outputs of which connect through 1 kohm pull up resistors to a +5 voltage source, as shown, allow for selection of the 4K increment of memory within the arrays 20-2 and 20-3. The output terminal of each position of the segment switches 20-81 and 20-82 connect to a different one of the input terminals of multiplexer circuits 20-89 and 20-90, as shown. The data select terminals of each of the multiplexer circuits 20-89 and 20-90 receive signals MAIR0110 through MAIR0310 from address register 20-60. As mentioned, the signal MAIRAB11 and its complement MAIRAB00 are applied to the enabling terminals of the multiplexer circuits 20-90 and 20-89, respectively.

A 4K increment of memory was chosen because the sections 20-2 and 20-3 may be also populated with RAM chips which have one-fourth the memory capacity (i.e., 4K RAM chips). Since both the 4K and 16K chips are pin compatible, each can use a common board design. Where only 16K RAM chips are utilized, the number of switch positions of switches 20-81 and 20-82 can be reduced to four.

The output terminals of the multiplexer circuits 20-89 and 20-90 are applied as inputs to an AND gate 20-91. The AND gate 20-91 forces the memory present signal MMPRES00 to a binary ZERO when the particular increment of a particular segment of memory is being addressed. The signal MMPRES00 is, in turn, applied to a NAND gate 20-92 which is operative to force memory present signal MMPRES10 to a binary ONE when the correct address segment and increment is addressed. This signal is in turn stored in one of the stages of register 20-60.

As seen from FIG. 4, the address signals stored in address register 20-60 are also applied as inputs to rotating chip select circuit section 20-10. Since this section is not pertinent to the understanding of the present invention, it will not be discussed further herein. For the purposes of explanation, this section generates the appropriate row select signals for accessing the correct increment of memory.

The row select signals generated by section 20-10 are applied as one input to a group of NAND gates 20-120 through 20-126 of section 20-12. The gates also receive a refresh command signal MREFCM00. The output signals MSROW010 through MSROW310 are, in turn, applied to another group of NAND gates 20-130 through 20-136 of section 20-12. Each of the NAND gates 20-130 through 20-136 receive a memory present row address strobe signal MMPRAS10 generated by the gates circuits 20-138 through 20-142. The signal MMPRAS10 is forced to a binary ONE when the appropriate memory segment and increment has been addressed (i.e., MMPRES21 is a binary ONE) and a row address strobe signal MPRASM10 is also a binary ONE. This signal is normally set to a binary ONE state during a read or write cycle of operation.

Additionally, the signal MMPRES21 is applied to a NAND gate 20-146 whose output connects to the refresh bus line REFSRH00 of bus 10. The NAND gate 20-146 receives a timing signal MDL32010 via a pair of inverter circuits 20-143 and 20-144 from delay line timing circuits conventional in design included in section 20-12 which establish the overall memory timing.

As seen from FIG. 4, the output signals MTRAS000 through MTRAS300 are applied as inputs to the chips of sections 20-2 and 20-3. As mentioned, the sections 20-2 and 20-3 can be populated to include up to 4 rows of 16K RAM chips. However, as mentioned, the section 20-2 is populated with 16 chips permanently mounted at physical location row 0. Thus, only output signal MTRAS000 is utilized.

Various combinations of address signals MAIRA010 through MAIRA610 are applied to the address input terminals of each of the 16K RAM chips. The scrambling of addresses enables the same memory board to be constructed with 4K RAM chips in lieu of 16K RAM chips, as mentioned previously. Each of the chips 20-20 through 20-35 is connected to receive the memory row selection or chip selection signal MTRAS000. When the signal MTRAS000 is a binary ZERO, this enables the address signals applied to the terminals of each RAM chip to be strobed or loaded into the row address register circuits internal to such chips. Each chip receives a different one of the data input signals MDIR0010 through MDIR1510 from data registers 20-40 and 20-42. The output signals MDOC000110 through MDOC150110 from each of the chips are applied to the data out register 20-16.

Figure 5:
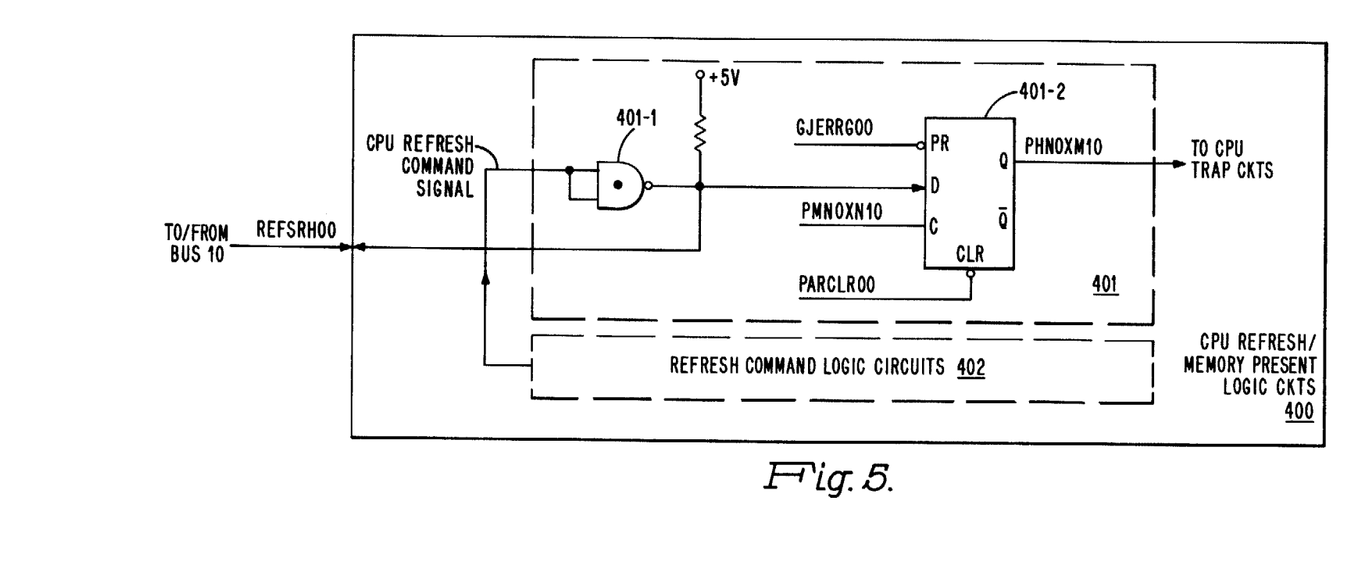
FIG. 5 shows in greater detail the refresh/memory present circuits included within the central processing unit of FIG. 1.

CPU Circuits-Figure 5

FIG. 5 shows in greater detail a portion of the refresh and memory present logic circuits of block 400. As seen from the Figure, circuits within block 401 force the refresh line REFSRH00 to a binary ZERO when the CPU circuits of block 402 generate a refresh command signal to memory subsystem 20. That is, the command signal causes a NAND gate 401-1 to switch the REFSRH00 line from +5 volts to ground or zero volts. In the absence of a CPU refresh command, a +5 volt signal is applied to a D input terminal of a D type flip-flop 401-2. The binary ONE side of the flip-flop 401-2 is in turn applied as an input to the trap/interrupt circuits of CPU 40. During the time interval of a memory cycle established by a clocking signal PMNOXN10, the state of the refresh line REFSRH00 is sampled. When the memory location being addressed is present, the circuits of section 20-12 of FIG. 4 operate to force the REFSRH00 line to a binary ZERO. Therefore, flip-flop 401-2 switches to a binary ZERO state. When the memory location being addressed is not present, the +5 volt signal applied to the D input terminal switches the flip-flop 401-2 to a binary ONE. This forces a non-existent memory signal PHNOXM10 to a binary ONE which, in turn, causes CPU 40 to interrupt its processing.

DESCRIPTION OF OPERATION

With reference to FIGS. 1 through 5, the method and operation of the apparatus of the present invention will now be described. By way of example, it is assumed that the memory module boards being constructed include four rows of RAM chips which provide a 64K increment of addressable memory space. Typically, a memory subsystem can have from 64K words of memory up to 256K words of memory.

It will be noted that memory subsystems which do not include the memory present apparatus of the present invention require four different types of memory boards. That is, when a user purchases an intital 64K segment of memory, the first memory board is wired to detect address signals within the range 0-64K. When the user wants to expand the memory subsystem to 128K, a second type of memory module board must be added to the subsystem. In this case, the board must be specially wired to respond to the next range of address signals corresponding to the range 64K-128K.

Similarly, when the user wishes to expand the memory subsystem to 192K or 256K, this again requires the addition of two more new types of memory module boards. The board which provides a 192K memory capacity must respond to addresses within the range 128K-192K while the board which provides for the 256K capacity must be wired to respond to addresses within the range 192K-256K.

By contrast, the memory present apparatus of the present invention eliminates the need for a manufacturer to construct four different board types. The arrangement, in fact, requires that only a single board type be constructed to provide for the same expansion provided in the first case. This board as discussed relative to FIG. 4 is constructed to have four rows of 16K RAM chips.

In the case of the first 64K memory module board, positions 1 and 3 of range switch 20-80 are open ("off") while positions 2 and 4 are closed ("on"). All other positions of switches 20-81 and 20-82 are open ("off"). This indicates that the address range for this memory module extends from 0 to 64K of addressable memory space.

When signals BUSBOE10 and BUSBOF10 are forced to binary ZEROS, signals MAIROAOB and MAIROBOA are binary ONES. This causes AND gate 20-85 to force signal MAIRAB10 to a binary ONE. Depending upon which half of the 64K segment being addressed, one of the NAND gates 20-87 and 20-88 forces its output low enabling a corresponding one of the multiplexer circuits 20-89 and 20-90. This results in either signal MPRASA00 or signal MPRASB00 being forced to a binary ZERO state.

The NAND gate 20-92 forces signal MMPRES10 to a binary ONE. This, in turn, causes address register 20-60 to switch signal MMPRES21 to a binary ONE. This results in AND gate 20-142 allowing signal MMPRAS10 to be switched to a binary ONE. As seen from FIG. 4, signal MMPRES21 together with timing signal MDL32021 causes NAND gate 20-146 to force the refresh line REFSRH00 to a binary ZERO. This causes the CPU flip-flop 401-2 of FIG. 5 to switch to a binary ZERO signaling that the memory location being addressed is present.

The section 20-10 forces one of the output signals, MRCS0000-MRCS0300 to a binary ZERO causing a corresponding one of the NAND gates 20-120 to 20-126 to force one of the signals MSROW010-MSROW310 to a binary ONE. The result is that one of the NAND gates 20-130 to 20-136 forces a corresponding one of the row select signals MTRAS000-MTRAS300 to a binary ZERO enabling one of the row of chips for operation.

When the user desires to expand his memory subsystem to have a 128K capacity or install a 64K-128K memory segment, another 64K memory module board identical in construction to the first board is added to the memory sybsystem 20.

Now, the case of the second board, the various address bus and data connections are identical to those of the first board. However, positions 1 and 4 of range switch 20-80 are opened ("off") while positions 2 and 3 are closed ("on"). This establishes an address range of 64K through 128K of addressable memory space. Accordingly, when signals BUSBOE10 and BUSBOF10 are forced to a binary ZERO and a binary ONE, AND gate 20-85 forces signal MAIRAB10 to a binary ONE.

In the manner previously described, this causes one of the multiplexer circuits 20-89 and 20-90 to force signal MMPRES10 to a binary ONE enabling the subsequent generation of a row select signal and the forwarding of a memory presence signal to CPU circuits 400.

To expand the capacity of memory subsystem 20 to 192K or install a 128K-192K memory segment, another memory module board identical to the previous boards is plugged in or added to the subsystem. When installed, the memory board is connected to receive the same bus input signals and address and data signals as the first board. However, the range switch 20-80 is positioned as follows. Positions 1 and 4 of range switch 20-80 are closed ("on") while positions 2 and 3 of the switch are opened ("off").

During operation, when signals BUSBOE10 and BUSBOF10 have a value of "10", the memory present circuits of section 20-8 force signal MMPRES10 to a binary ONE.

Where the memory subsystem 20 is expanded to include a memory segment of 192K-256K, a fourth memory module board identical in construction to the first three is installed into the subsystem 20. In this particular case, the positions 1 and 3 of range switch 20-80 are "on" while positions 2 and 4 are "off" to specify an address segment between 192K and 256K. This means that when signals BUSBOE10 and BUSBOF10 have a value of "11", the memory present circuits of section 20-8 force signal MMPRES10 to a binary ONE.

From the above, it is seen that the memory present apparatus, included within memory module boards of identical construction and type, operate to permit the positioning of a 64K segment within a number of different ranges of addresses within a subsystem.

It will be noted that the apparatus and method of the present invention permits memory subsystems to be constructed with a single type of memory module board. This arrangement allows the manufacturer of such memory subsystems to build one board type and retain, for maintenance purposes, one type of memory board.

While in accordance with the provisions and statutes there has been illustrated and described the best form of the invention, certain other changes may be made without departing from the spirit of the invention as set forth in the appended claims and that in some cases, certain features of the invention may be used to advantage without a corresponding use of other features.

What is claimed is:

1. A memory subsystem comprising at least one memory module board coupled to receive a plurality of address signals specifying a memory location to be accessed within said subsystem, said board including a control section and a memory section having a predetermined number of physical row locations of memory chips, said predetermined number of rows of memory chips corresponding to a segment of addressable memory space and each row of chips corresponding to an increment of memory space, said control section including:

range switch means connected for receiving a first portion of said plurality of address signals coded to specify said segment and said range switch means being selectively positioned to generate coded signals specifying one of a predetermined number of segments in response to said first portion;

circuit means connected to receive said coded signals from said range switch means and being operated to logically combine said coded signals to generate a resulting signal;

register means for receiving another portion of a plurality of address signals coded for specifying said increment of said locations to be accessed; and, memory present circuit means coupled to said circuit means and to said register means, said memory present circuit means being conditioned by said resulting signal and said another portion of said plurality of address signals to generate a memory present signal for enabling the accessing of a location within said increment of said one segment specified by said range switch means.

2. The memory subsystem of claim 1 wherein said range switch means includes a plurality of manually selectable switch positions for generating a set of binary coded signals representative of any one of said predetermined number of segments.

3. The memory subsystem of claim 2 wherein said circuit means includes AND gating means for logically combining said coded signals to generate said resulting signal.

4. The memory subsystem of claim 1 wherein said memory present circuit means comprises:

increment selection means being selectively positioned for generating output signals designating which increments of said segment are being provided by said addressable memory chips of said memory section;

selector means being connected to receive said output signals from said increment selection means and said another portion of said memory address signals, said selector means being conditioned by said another portion of said memory address signals when enabled by said resulting signal to generate an output signal for indicating whether said increment to be accessed is within said segment; and, gating means coupled to said selector means and to said memory section, said gating means generating signals for enabling access to a location within said increment in response to said output signal.

5. The memory subsystem of claim 4 wherein said subsystem operatively couples to a bus in common with a central processing unit, said control section further including:

indicating means coupled to said memory present circuit means and to a predetermined one of a number of bidirectional control lines which comprise said bus, said indicating means when conditioned by said output signal being operative to force said one bidirectional control line to a predetermined state during a memory cycle of operation when said one line is not being used by said processing unit for signaling said central processing unit that the increment of memory being accessed is present.

6. The memory subsystem of claim 5 wherein said indicating means includes:

bistable means coupled to said memory present circuit means, said bistable storage means being operative in response to said output signal to switch from a first state to a second state for indicating when the increment being accessed is present; and, gating means coupled to said bistable storage means and coupled to receive a timing signal, said gating means being operative in response to said timing signal when said bistable storage means in said second state to force said one bidirectional control line to said predetermined state.

7. The memory subsystem of claim 4 wherein said increment selector means includes a number of manually selectable switch positions, each switch position for generating a different one of said output signals for designating a different increment within said segment of addressable memory space and predetermined ones of said switch positions each being placed in a predetermined state for generating said output signal in response to said another portion of said memory address signals when coded to specify a corresponding one of said increments of said segment.

8. The memory subsystem of claim 7 wherein said selector means includes a plurality of data selection terminals, an enabling input terminal, a plurality of input terminals corresponding in number to said number of selectable switch positions and at least one output terminal, said plurality of data selection terminals being connected to receive signals corresponding to said another portion and said enabling input terminal being connected to receive said resulting signal, each of said plurality of input terminals being connected to a corresponding one of said number of said selectable switch positions and said output terminal being coupled to said gating means, said selector means when enabled by said resulting signal in response to said another portion signals to apply to said output terminal, said output signal from a selected one of said selectable switch positions for indicating whether said memory segment includes said increment specified by said another portion.

9. The memory subsystem according to claim 8 wherein said subsystem is expanded to further include a second memory module board identical in construction to said one memory module board coupled to receive said plurality of address signals and said range switch means of said one and said second memory module boards being selectively positioned to generate signals having values of "00" and "01" respectively in response to said first portion to provide a continuous address space made up of two like segments using identical memory module boards having identical addressing connections.

10. The memory subsystem of claim 9 wherein said range selection means of said one and said second memory module boards are arranged to generate resulting signals designating first and second segments of said address space to be accessed.

11. The memory subsystem of claim 10 wherein said subsystem is expanded to further include a third memory module board identical in construction to said one memory module board coupled to receive said plurality of address signals and said range switch means of said third memory module board being selectively positioned to generate signals having a value of "10" in response to said first portion to provide said continuous address space made up of three like segments of memory chips using said same type of memory module board having identical addressing connections.

12. The memory subsystem of claim 11 wherein said subsystem is expanded to further include a fourth memory module board identical in construction to said one memory module board coupled to receive said plurality of address signals and said range switch means of said fourth memory module board being selectively positioned to generate signals having a value of "11" in response to said first portion to provide said continuous address space made of four like segments of memory chips using said same type of memory module board.

13. The memory subsystem of claim 12 wherein said range switch means of said third and fourth memory module boards are arranged to generate said resulting output signals designating third and fourth segments of said address space to be accessed.

14. A memory module board for providing any one of a number of like segments of addressable memory space within a memory subsystem, said memory module board comprising:
  a number of rows of addressable memory chips for providing a plurality of addressable storage locations defining a segment;
  range switch selection means connected to receive a set of signals corresponding to a first portion of a memory address coded to specify said memory segment to be accessed, said range switch selection means being selectively positioned in accordance with the location of said module board within said subsystem to modify said set of signals for providing a set of coded signals designating one of said segments;
  circuit means connected to receive said set of coded signals from said range switch means and being operated to logically combine said coded signals to generate a resulting signal;
  register means for storing a second selected portion of said memory address coded to specify the row of chips of one of said plurality of storage locations;
  memory present circuit means coupled to said circuit means and to said register means, said memory present circuit means being conditioned by said resulting signal and said another portion of said plurality of address signals to generate a memory present signal for enabling the accessing of a storage location within a specified one of said rows of said one segment.

15. The memory board of claim 14 wherein said range switch means includes a plurality of manually selectable switch positions for generating a set of coded signals representative of any one of said number of segments.

16. The memory board of claim 15 wherein said circuit means includes AND gating means for logically combining said coded signals to generate said resulting signal.

17. The memory board of claim 14 wherein said memory present circuit means comprises:
  increment selection means being selectively positioned for generating output signals designating which increments of said segment are being provided by said rows of addressable memory chips;
  selector means being connected to receive said memory present signal from said increment selection means and said second portion of said memory address, said selector means being conditioned by said second portion when enabled by said resulting signal to generate an output signal for indicating whether said increment to be accessed is within said segment; and,
  gating means coupled to said selector means and to said memory section, said gating means generating signals for enabling access to a location within said increment in response to said output signal.

18. The memory board of claim 17 wherein said increment selector means includes a number of manually selectable switch positions, each switch position for generating a different one of said output signals for designating a different increment within said segment of addressable memory space and predetermined ones of said switch positions each being placed in a predetermined state for generating a different one of said output signals in response to said second portion of said memory address signals when coded to specify a corresponding one of said increments of said segment.

19. The memory board of claim 18 wherein said selector means includes a plurality of data selection terminals, an enabling input terminal, a plurality of input terminals corresponding in number to said number of selectable switch positions and at least one output terminal, said plurality of data selection terminals being connected to receive signals corresponding to said second portion and said enabling input terminal being connected to receive said resulting signal, each of said plurality of input terminals being connected to a corresponding one of said number of said selectable switch positions and said output terminal being coupled to said gating means, said selector means when enabled by said resulting signal in response to said second portion to apply to said output terminal, said output signal from a selected one of said selectable switch positions for indicating whether said memory segment includes said increment specified by said second portion.

20. The memory board according to claim 19 wherein said subsystem is expanded to further include a second memory module board identical in construction to said one memory module board coupled to receive said plurality of address signals and said range switch means of said one and said second memory module boards being selectively positioned to generate signals having values of "00" and "01" respectively in response to said first portion to provide a continuous address space made up of two like segments constructed from identical memory module boards having identical addressing connections.

21. The memory board of claim 20 wherein said subsystem is expanded to further include a third memory module board identical in construction to said one memory module board and being coupled to receive said plurality of address signals, said range switch means of said third memory module board being selectively positioned to generate signals having a value of "10" in response to said first portion to provide said continuous address space made of three like segments of memory chips constructed from the same tupe of memory module board having identical addressing connections.

22. The memory board of claim 21 wherein said subsystem is expanded to further include a fourth memory module board identical in construction to said one memory module board and being coupled to receive said plurality of address signals, said range switch means of said fourth memory module board being selectively positioned to generate signals having a value of "11" in response to said first portion to provide said continuous address space made of four like segments of memory chips constructed from said same type of memory module board with identical addressing connections.

23. The memory board of claim 14 wherein said subsystem operatively couples to a bus in common with a central processing unit, said control section further including:
indicating means coupled to said memory present circuit means and to a predetermined one of a number of bidirectional control lines which comprise said bus, said indicating means when conditioned by said output signal being operative to force said one bidirectional control line to a predetermined state during a memory cycle of operation when said one line is not being used by said processing unit for signaling said central processing unit that said location being accessed is present.

24. The memory board of claim 23 wherein said indicating means includes:
bistable means coupled to said memory present circuit means, said bistable storage means being operative in response to said output signal to switch from a first state to a second state for indicating when said location being accessed is present; and,
gating means coupled to said bistable storage means and coupled to receive a timing signal, said gating means being operative in response to said timing signal when said bistable storage means in said second state to force said one bidirectional control line to said predetermined state.

25. A memory subsystem constructed to facilitate expansion and repair, said subsystem being connected to a bus in common to a processing unit and comprising:
a plurality of memory module boards, each board being identical in construction and having identical address connections for receiving a plurality of address signals from said bus specifying a location within said subsystem to be accessed, each board including a memory section and control section;
each said memory section including a number of rows of addressable memory chips for providing a plurality of storage locations, each row corresponding to a different increment of a memory segment; and,
said control section including:
manually selectable range switch being connected for receiving a first portion of said plurality of address signals coded to specify the segment and said range switch being selectively positioned in accordance with the placement of said module board within said subsystem to generate coded signals specifying a desired segment in response to said first portion;
circuit means connected to receive said coded signals and being operated to logically combine said coded signals to generate a resulting signal;
a register for receiving another portion of said plurality of address signals coded for specifying said increment of said segment to be accessed; and,
memory present circuit means coupled to said circuit means and to said register, said memory present circuit means being conditioned by said resulting signal and said another portion of said plurality of address signals to generate a memory present signal for enabling access to a location in said increment of the segment specified by the positioning of said range switch.

26. The memory subsystem of claim 25 wherein said control section further includes:
indicating means coupled to said memory present circuit means and to a predetermined one of a number of bidirectional control lines which comprise said bus, said means indicating when conditioned by said output signal being operative to force said one bidirectional control line to a predetermined state during a memory cycle of operation when said one line is not being used by said processing unit for signaling said processing unit that the location being accessed is present.

27. The memory subsystem of claim 26 wherein said indicating means includes:
bistable means coupled to said memory present circuit means, said bistable storage means being operative in response to said output signal to switch from a first state to a second state for indicating when the location being accessed is present; and, gating means coupled to said bistable storage means and coupled to receive a timing signal, said gating means being operative in response to said timing signal when said bistable storage means in said second state to force said one bidirectional control line to said predetermined state.

28. The memory subsystem of claim 25 wherein said memory present circuit means comprises:

manually selectable increment switch means being selectively positioned for generating output signals designating which increments of said segment are being provided by said rows of addressable memory chips;

selector means being connected to receive said output signals from said increment selection means and said another portion of said memory address signals, said selector means being conditioned by said another portion of said memory address signals when enabled by said resulting signal to generate an output signal for indicating whether said increment to be accessed is within said segment; and, gating means coupled to said selector means and to said memory section, said gating means generating signals for enabling access to a location within said increment in response to said output signal.

29. The memory subsystem according to claim 25 wherein said subsystem includes a second board and said range switch means of said one and said second memory module boards being selectively positioned to generate signals having values of "00" and "01" respectively in response to said first portion to provide a continuous address space made up of two like segments.

30. The memory subsystem of claim 29 wherein said subsystem includes a third memory module board and said range switch means of said third memory module board being selectively positioned to generate signals having a value of "10" in response to said first portion to provide said continuous address space made up of three like segments.

31. The memory subsystem of claim 30 wherein said subsystem includes a fourth memory module board and said range switch means of said fourth memory module board being selectively positioned to generate signals having a value of "11" in response to said first portion to provide said continuous address space made of four like segments.

* * * * *